(12) United States Patent
White et al.

(10) Patent No.: US 10,374,110 B2
(45) Date of Patent: Aug. 6, 2019

(54) TRANSDUCING APPARATUS AND METHOD FOR PROVIDING SUCH APPARATUS

(71) Applicant: Nokia Technologies Oy, Espoo (FI)

(72) Inventors: Richard White, Cambridgeshire (GB); Elisabetta Spigone, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 86 days.

(21) Appl. No.: 15/538,696

(22) PCT Filed: Nov. 5, 2015

(86) PCT No.: PCT/FI2015/050763
§ 371 (c)(1),
(2) Date: Jun. 22, 2017

(87) PCT Pub. No.: WO2016/102745
PCT Pub. Date: Jun. 30, 2016

(65) Prior Publication Data
US 2017/0373205 A1    Dec. 28, 2017

(30) Foreign Application Priority Data

Dec. 23, 2014  (EP) .................................... 14199988

(51) Int. Cl.
| | |
|---|---|
| H01L 29/16 | (2006.01) |
| H01L 37/02 | (2006.01) |
| H01L 41/18 | (2006.01) |
| H01L 51/05 | (2006.01) |
| H01L 29/778 | (2006.01) |
| H01L 31/028 | (2006.01) |
| H01L 31/115 | (2006.01) |

(Continued)

(52) U.S. Cl.
CPC .. *H01L 31/035218* (2013.01); *H01L 29/1606* (2013.01); *H01L 29/778* (2013.01);
(Continued)

(58) Field of Classification Search
CPC ... H01L 31/115; H01L 51/0558; B82Y 30/00; G21H 1/04; G01T 1/242
See application file for complete search history.

(56) References Cited

U.S. PATENT DOCUMENTS

2012/0175584 A1* 7/2012 Weinberg .................. G01T 1/16
257/12
2013/0084496 A1* 4/2013 Osada ................... H01M 4/134
429/211

(Continued)

FOREIGN PATENT DOCUMENTS

WO    WO 2015/200758 A2    12/2015

OTHER PUBLICATIONS

Xu, Rongqing, et al., "Facile Fabrication of Three-Dimensional Graphene Foam/Poly (dimethylsiloxane) Composites and Their Potential Application as Strain Sensor", © 2014 American Chemical Society, 7 pgs.

(Continued)

*Primary Examiner* — Changhyun Yi
(74) *Attorney, Agent, or Firm* — Harrington & Smith

(57) ABSTRACT

An apparatus and method, the apparatus including a charge carrier wherein the charge carrier includes a continuous three dimensional framework including a plurality of cavities throughout the framework; sensor material provided throughout the charge carrier; wherein the sensor material is configured to transduce a detected input and change conductivity of the charge carrier in dependence of the detected input.

14 Claims, 5 Drawing Sheets

(51) Int. Cl.
  *H01L 31/0224*  (2006.01)
  *H01L 31/0352*  (2006.01)
  *H01L 31/0384*  (2006.01)

(52) U.S. Cl.
  CPC ........ *H01L 31/028* (2013.01); *H01L 31/0224* (2013.01); *H01L 31/03845* (2013.01); *H01L 31/115* (2013.01); *H01L 51/0558* (2013.01); *H01L 37/025* (2013.01); *H01L 41/183* (2013.01); *Y02E 10/547* (2013.01)

(56) References Cited

U.S. PATENT DOCUMENTS

2013/0187056 A1* 7/2013 Nikolic .................... G01T 3/00
   250/370.05
2015/0001406 A1* 1/2015 Coleman ............... G01T 1/2018
   250/366
2016/0305824 A1* 10/2016 Ozyilmaz ................. G01J 5/34

OTHER PUBLICATIONS

Yue, Hong Yan, et al., "ZnO Nanowire Arrays on 3D Hierarchical Graphene Foam: Biomarker Detection of Parkinson's Disease", ACS NANO, Feb. 25, 2014, 8 pgs.

Zhan, Beibei, et al., "Graphene Field-Effect Transistor and Its Application for Electronic Sensing", © 2014 Wiley-VCH Verlag GmbH & Co. KGaA, Weinheim, 25 pgs.

Boruah, Buddha Deka, et al., "Highly Dense ZnO Nanowires Grown on Graphene Foam for Ultraviolet Photodetection", © 2015 American Chemical Society, 7 pgs.

* cited by examiner

_US 10,374,110 B2_

TRANSDUCING APPARATUS AND METHOD FOR PROVIDING SUCH APPARATUS

TECHNOLOGICAL FIELD

Examples of the present disclosure relate to a transducing apparatus and method for providing such apparatus. In particular, they relate to a transducing apparatus and method wherein the sensor material is provided throughout a charge carrier.

BACKGROUND

Transducers comprising sensor material are known. The sensor material is typically arranged to convert a detected parameter into a measurable electronic response. For instance photodetectors comprising a graphene field effect transistor (GFET) covered by a thin layer of quantum dots are known. This enables incident light to be converted into electrical charge which can then be measured. It is useful to enable such devices to operate efficiently.

BRIEF SUMMARY

According to various, but not necessarily all examples of the disclosure, there may be provided an apparatus comprising: a charge carrier wherein the charge carrier comprises a continuous three dimensional framework comprising a plurality of cavities throughout the framework; sensor material provided throughout the charge carrier; wherein the sensor material is configured to transduce a detected input and change conductivity of the charge carrier in dependence of the detected input.

In some examples the sensor material may comprise quantum dots.

In some examples the three dimensional framework of the charge carrier may be formed from a two-dimensional material. The two dimensional material may form the boundaries of the cavities.

In some examples sensor material may be provided within the cavities.

In some examples the charge carrier may comprise graphene foam.

In some examples the charge carrier may be configured to conduct charge in any direction.

In some examples the detected input may comprise at least one of, incident electromagnetic radiation, change in temperature, pressure, or change in shape. The electromagnetic radiation may comprise X-rays.

In some examples the charge carrier may be provided on an insulating substrate.

In some examples the charge carrier may be provided between two electrodes.

In some examples there may be provided a transistor comprising an apparatus as described above. The transistor may comprise a thin film transistor.

According to various, but not necessarily all examples of the disclosure, there may be provided a method comprising: providing a charge carrier wherein the charge carrier comprises a continuous three dimensional framework comprising a plurality of cavities throughout the framework; providing sensor material throughout the charge carrier; wherein the sensor material is configured to transduce a detected input and change conductivity of the charge carrier in dependence of the detected input.

In some examples the sensor material may comprise quantum dots.

In some examples the three dimensional framework of the charge carrier may be formed from a two-dimensional material. The two dimensional material may form the boundaries of the cavities.

In some examples the sensor material may be provided within the cavities.

In some examples the charge carrier may comprise graphene foam.

In some examples the charge carrier may be configured to conduct charge in any direction.

In some examples the detected input may comprise at least one of, incident electromagnetic radiation, change in temperature, pressure, or change in shape. The electromagnetic radiation may comprise X-rays.

In some examples the method may further comprise providing the charge carrier on an insulating substrate.

In some examples the method may further comprise providing the charge carrier between two electrodes.

According to various, but not necessarily all, examples of the disclosure there may be provided examples as claimed in the appended claims.

BRIEF DESCRIPTION

For a better understanding of various examples that are useful for understanding the detailed description, reference will now be made by way of example only to the accompanying drawings in which.

DETAILED DESCRIPTION

The Figures illustrate an apparatus 1 comprising: a charge carrier 3 wherein the charge carrier 3 comprises a continuous three dimensional framework comprising a plurality of cavities 7 throughout the framework; sensor material 5 provided throughout the charge carrier 3; wherein the sensor material 5 is configured to transduce a detected input and change conductivity of the charge carrier 3 in dependence of the detected input.

The apparatus 1 may be for transducing a detected input into an electrical output signal. In some examples the detected input may be incident electromagnetic radiation. The electromagnetic radiation may comprise X-rays. In some examples the electromagnetic radiation may comprise radiation from other parts of the spectrum such as infra red or visible light. In other examples the apparatus 1 may be configured to detect other inputs such as changes in temperature, pressure shape or other physical parameter.

Figure 1:
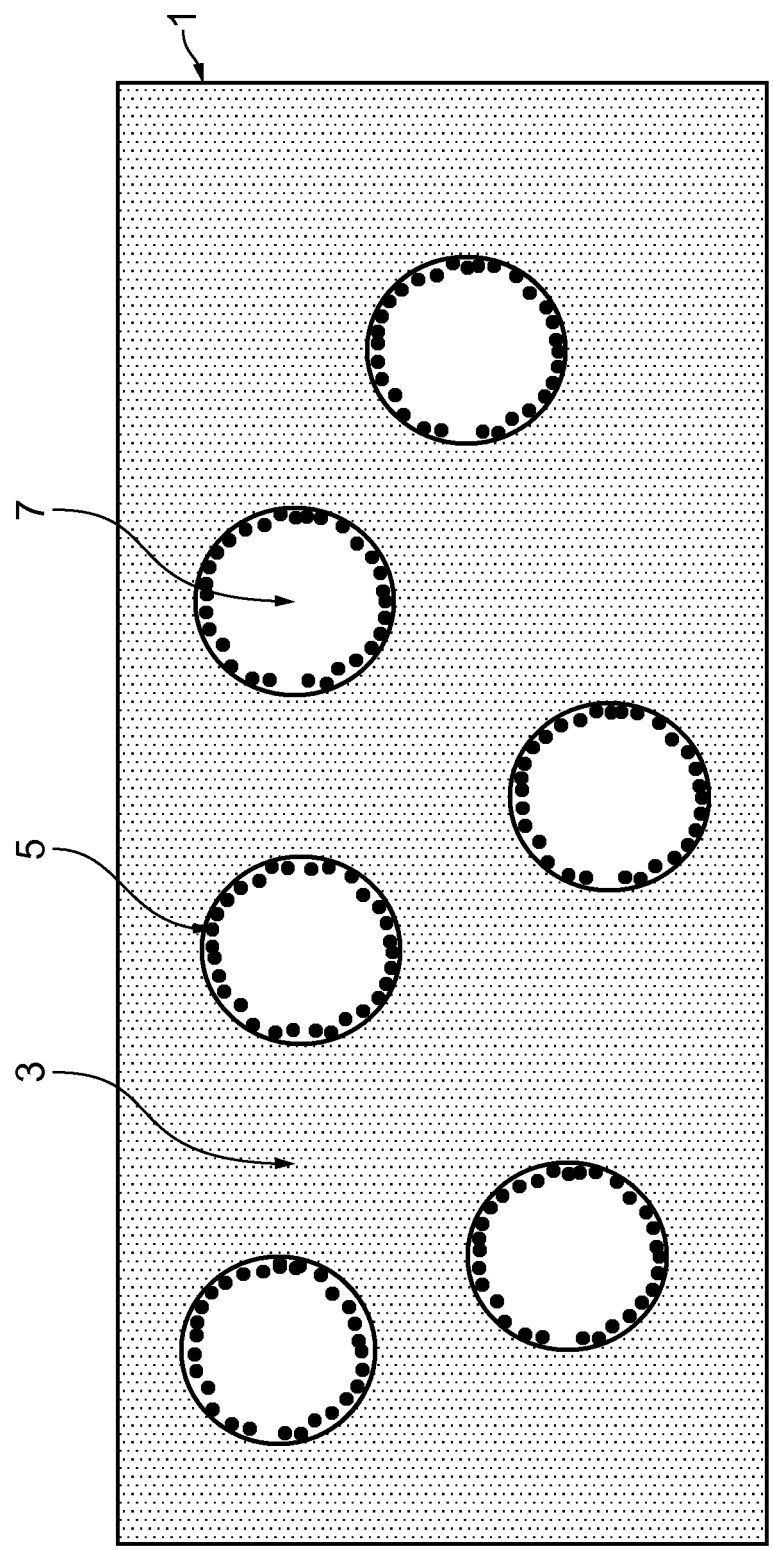
FIG. 1 illustrates an apparatus.

FIG. 1 illustrates an apparatus 1 according to examples of the disclosure. The apparatus 1 comprises a charge carrier 3 and sensor material 5. The sensor material 5 is distributed throughout the charge carrier 3.

The charge carrier 3 may comprise any conductive material which may be configured to conduct electric charges. The conductive material may have high carrier mobility. In some examples the conductive material may be sensitive to changes in the charge density in the region around the conductive material. In some examples the conductive material may provide for a fast charge transfer from the sensor material 5 to the charge carrier 3.

In some examples the charge carrier 3 comprises a continuous three dimensional framework comprising a plurality of cavities throughout the framework. The three dimensional framework of the charge carrier 3 may be formed from a two-dimensional material. The two dimensional material may comprise any suitable two dimensional material such as graphene. The two dimensional material may comprise a monolayer material, a bi-layer material or a multi layer material. The multi layer material may comprise a plurality of layers but may still form a thin material.

In some examples the three dimensional structure may be amorphous however the two dimensional material may be regularly structured. This may enable the charge carrier to be structured at a scale of nanometers but amorphous at a scale of micrometers.

The charge carrier 3 may be continuous in that the three dimensional framework may be the same or similar in any direction. The connections between the material which form the frame work may extend in any direction throughout the three dimensional layer. The charge carrier 3 may be continuous as opposed to laminar so that there are no discontinuities in the structure of the three dimensional framework. This may enable the charge carrier 3 to be configured to conduct charge in any direction.

The two dimensional material may form the boundaries of the cavities 7. The cavities 7 may be distributed throughout the charge carrier. The cavities 7 may be arranged to provide a very large surface area of the two dimensional material. In some examples the two dimensional material may be arranged to form a foam like structure.

In some examples the two dimensional material may comprise a material such as graphene. in some examples the charge carrier 3 may comprise a material such as graphene foam or any other suitable material. The graphene foam may be formed using any suitable technique such as chemical deposition on copper foam and the using an etchant such as ferric chloride to etch the copper. The dimensions of the graphene foam and/or the cavities 7 within the foam may be formed so as to optimise the response of the apparatus 1 to the detected input. For instance, the dimensions of the graphene foam may be selected in dependence upon the charge transfer characteristics and field effect characteristics of the sensor material 5.

In other examples a graphene based charge carrier 3 may be formed by coating graphene ink with a sensor material 5. The graphene ink comprises graphene sheets in solution. The composite in solution may then be dried to form a network of layers of graphene arranged in a three dimensional structure.

The sensor material 5 may comprise any material which may be configured to convert a detected input signal to an electronic response. In some examples the electronic response may comprise a change in the charge distribution within the charge carrier 3. In some examples the electronic response may comprise an electric charge which may be transferred to the charge carrier 3. The electronic response which is provided may depend on the sensor material 5 which is used and input which is to be detected.

The sensor material 5 may be provided throughout the charge carrier 3. The sensor material 5 may be provided throughout the charge carrier 3 such that the sensor material 5 is in contact with the charge carrier 3 at all locations within the charge carrier 3. In some examples the sensor material 5 may be configured to be proximal to the charge carrier 3 at all locations within the charge carrier 3. The sensor material 5 may be configured to be in contact with the charge carrier 3 such that there is efficient charge transfer from the sensor material 5 to the charge carrier 3 at all points within the charge carrier 3. The charge transfer may occur, for instance, in examples where the sensor material comprises quantum dots.

In the example illustrated schematically in FIG. 1 the sensor material 5 is provided within the cavities 7 of the charge carrier 3. It is to be appreciated that other arrangements of the sensor material 5 may be provided in other examples. For instance, in some examples the sensor material 5 may be provided coating, or at least partially coating, the two dimensional material which forms the three dimensional framework.

In some examples the sensor material 5 may comprise quantum dots. The quantum dots may comprise a nanocrystal where there is quantum confinement in all three dimensions. In some examples the quantum dots may be configured to produce a change in electric charge in response to a detected input.

In other examples the sensor material 5 may comprise semiconductor nanocrystals. The semiconductor nanocrystals may be formed in any suitable shape such as rods, stars, spheres or other shape. The semiconductor nanocrystals do not need to show quantum confinement in any or all of the dimension and so do not need to be a quantum dot.

The quantum dots which are used may depend upon the physical parameter which is to be detected. In some examples the quantum dots may be configured to sense incident electromagnetic radiation. The wavelength of the radiation which is detected may depend on the size of the quantum dots and/or the material used for the quantum dots. For example PbS quantum dots may be used to detect incident electromagnetic radiation such as X-rays or visible light. Graphite quantum dots or other suitable material may be used to detect infra red electromagnetic radiation.

In some examples the sensor material 5 may comprise a pyroelectric material which may produce a change in electric field with a change in temperature. Examples of suitable pyroelectric materials include Poly vinylidene fluoride (PVDF), P(VDF-trifluoroethylene), ceramics such as LiTaO3 or GaN or any other suitable material. The pyroelectric material may be provided as quantum dots or may be provided as a larger crystal or as a film coating the charge carrier 3.

In some examples the sensor material 5 may comprise a piezoelectric material which may produce a change in electric field when a stress is applied to the charge carrier 3 or if the shape of charge carrier 3 is changed. Examples of suitable piezoelectric materials include Poly vinylidene fluoride (PVDF) ceramics such as Lead Zirconate Titanate (PZT), BaTiO3, ZnO, or any other suitable material. The piezoelectric material may be provided as quantum dots or may be provided as a larger crystal or as a film coating the charge carrier 3.

The sensor material 5 may be arranged to respond to a physical parameter such as electromagnetic radiation, temperature, pressure, stress or any other suitable parameter. The detected input causes a change in the electrical properties of the sensor material 5. In some examples it may cause the creation of an electron-hole pair. This may increase the number of charges within the charge carrier 3. In other examples the detected input may cause a change in the electric field in the region around the sensor material 5. This may affect the density of charges within the charge carrier 3 and also the mobility of the charges within the charge carrier 3. This may produce a measurable change in the conductivity of the charge carrier 3.

In some examples the apparatus 1 may be provided on an insulating substrate. The apparatus 1 may be provided between conductive electrodes. The electrodes may be printed or otherwise deposited on the substrate. In some examples the apparatus 1 may form part of a transistor.

Figure 2:
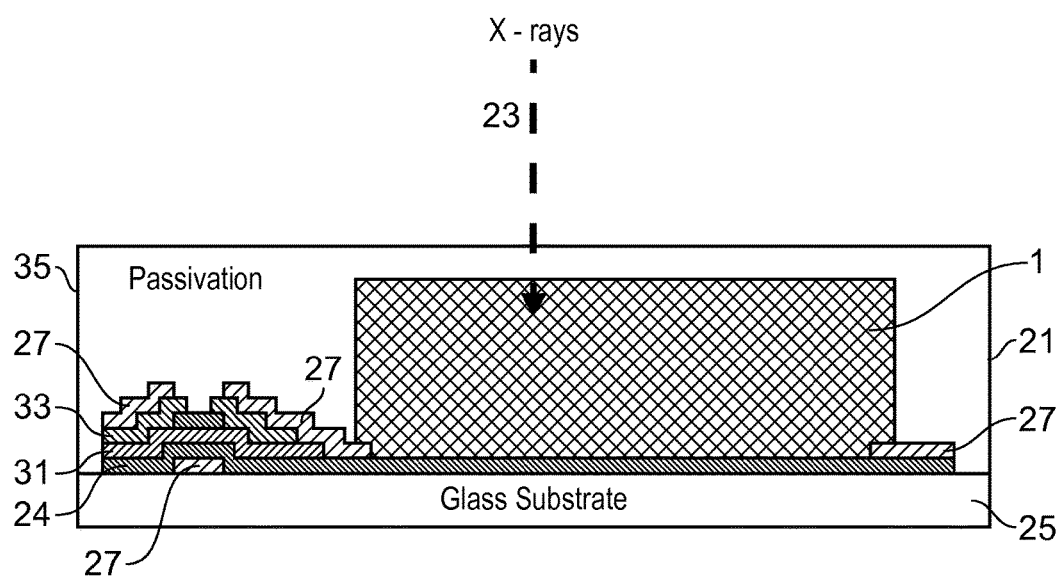
FIG. 2 illustrates a transistor which may comprise an apparatus.

An example of a transistor 21 is schematically illustrated in FIG. 2. In the example of FIG. 2 the transistor 21 is a thin film transistor. In the example of FIG. 2 the transistor is configured to detect incident X-rays 23. It is to be appreciated that in other examples a transistor 21 may be configured to respond to other inputs.

In the example of FIG. 2 the transistor 21 is formed on a substrate 25. The substrate 25 may comprise an insulating material. In the example of FIG. 2 the substrate 25 comprises glass. It is to be appreciated that other materials may be used in other examples of the disclosure. For example, in some cases the transistor 21 may be formed on a flexible substrate 25. This may enable a flexible or bendable transducing device to be provided. In such examples the substrate 25 may comprise any suitable flexible material such as a polymeric material.

The transistor 21 comprises a plurality of electrodes 27. The electrodes 27 may be made of any conductive material such as metals, Indium Tin oxide or any other suitable material. The electrodes 27 may be arranged to provide source, drain and gate electrodes. In some examples the electrodes 27 may be formed from a flexible material to enable a flexible or bendable transducing device to be provided.

The transistor 21 comprises an apparatus 1 as described above with reference to FIG. 1. The apparatus 1 forms a channel within the transistor. In examples where the channel may comprise a semimetal such as graphene. The apparatus 1 comprises quantum dots distributed through a charge carrier 3. It is to be appreciated that other sensor material could be used in other examples of the disclosure. The apparatus 1 may be provided between two electrodes 27 so that the change in conductivity caused by the incident X-rays 23 can be measured. The thickness of the apparatus 1 may be of the order of 100 micrometers. The size of the cavities 7 within the charge carrier 3 may be approximately 200 nm. It is to be appreciated that different dimensions may be used in other examples where different sensor material 5 is used and/or a different input is to be detected.

The transistor 21 also comprises a dielectric layer 29. The dielectric layer 29 is provided between the substrate 25 and the charge carrier 3 of the apparatus 1.

The transistor 21 also comprises active semiconductor layers provided between the electrodes 27. In the example of FIG. 2 the active semi-conductor layers comprise a layer of n-doped Silicon 31 and a layer of hydrogenated amorphous Silicon (a-Si:H) 33. Other materials may be used in other examples of the disclosure.

The transistor 21 also comprises a passivation layer 35 which is configured to coat the transistor 21 and protect it from environmental parameters. The passivation layer 35 may encapsulate the layers of the transistor 21. The passivation layer 35 may be transparent to the parameter which is to be detected. For instance, in the example of FIG. 2 the passivation layer 35 may allow X-rays 23 to pass through but may be configured to prevent fluids or other contaminants from reaching the transistor 21.

In the example of FIG. 2 the transistor 21 is configured to detect X rays 23. The apparatus 1 may comprise quantum dots which are sensitive to X-rays distributed through the charge carrier 3. In some examples the quantum dots may comprise PbS. In other examples other materials may be used such as PbSe, PbTe, CdS, CdSe, ZnO, ZnS, CZTS, Cu2S, Bi2S3, Ag2S, HgTe, CdHgTe, InAs, InSb or any other suitable material. The size of the quantum dots may be selected to ensure that the quantum dots are responsive to X-rays. The quantum dots may be any suitable shape.

When X-rays 23 are incident upon the transistor 21 this causes excitation of electrons within the quantum dots. As the energy of incident X-rays is high this can excite an electron across the band gap within the quantum dots to create electron-hole pairs. One charge may be transferred to charge carrier 3. In this example the hole is transferred to the graphene. The remaining charge is trapped within the quantum dot and acts to change the electric field around the quantum dot. This change in the electric field also changes the conductivity of the graphene.

As the quantum dots are in contact with the charge carrier 3 throughout the apparatus 1 this allows for fast transfer of the generated holes to the charge carrier 3. As the charge carrier 3 is made from a material with a high charge mobility, such as graphene, this causes the hole to be transferred through the charge carrier 3 before recombination can occur. This allows for an efficient transduction of X-rays 23 to electrical charge. In some examples the materials used for the sensor material 5 or quantum dots may be selected so that the work functions of the sensor material 5 and the charge carrier 3 are aligned. This may allow for the charges to be transferred from the sensor material to the charge carrier 3.

The above described examples provide for apparatus 1 and transistors 21 which allow X-rays 23 to be converted directly into electrical charge. This removes the need for a scintillator in an X-ray detector. This provides many advantages for X-ray detection because it removes problems associated with the scintillator such as inefficiency and non-linearity. It also reduces the number of components needed to make an X-ray detector and so may make the X-ray detectors easier to manufacture.

Figure 3:
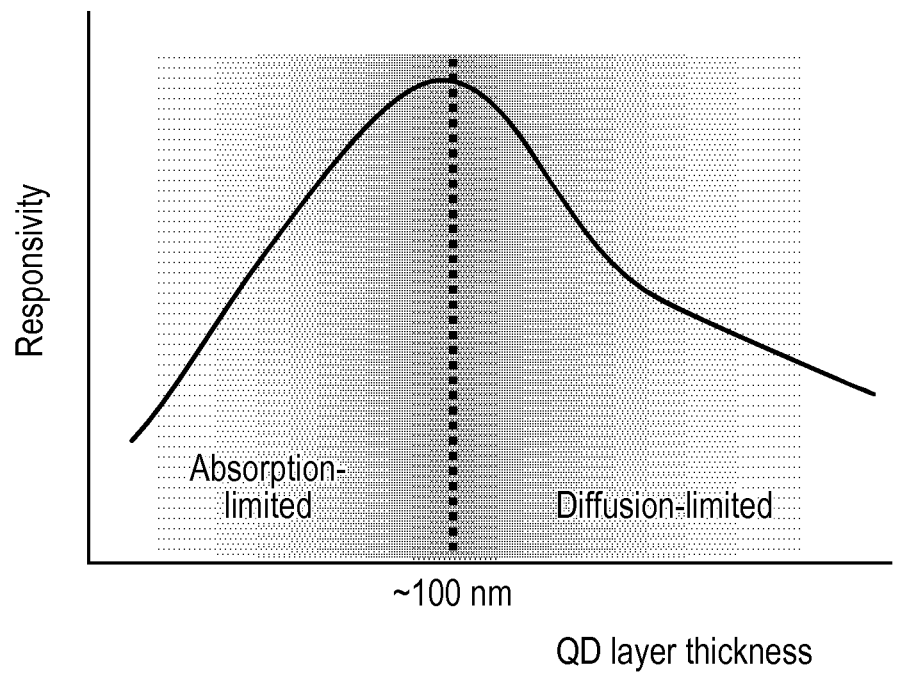
FIG. 3 illustrates responsivity of quantum dots.

The thickness of the quantum dots within the charge carrier 3 may be configured so as to optimise the efficiency of absorption of the X-rays. FIG. 3 shows that the responsivity of the quantum dot layer of PbS is optimised at around 100 nm. Therefore a coating of 100 nm of PbS around a two dimensional material is the most efficient arrangement for absorbing X-rays 23.

It is to be appreciated that the optimal thickness of the sensor material 3 may depend on factors such as the material used for the sensor material 5, the ligands used to attach the sensor material 5 to the charge carrier 3, the parameter which is to be detected or any other factor.

In the examples of the disclosure there are different ways in which sensor material 5 such as quantum dots can be provided within the charge carrier 3. In some examples the quantum dots may be sized so as to fit within the cavities 7 formed by the two dimensional material. In such examples the cavities 7 may be sized to be approximately 200 nm wide. This enables a quantum dot with a radius of 100 nm to fit in the cavity 7. This effectively gives a 100 nm quantum dot coating to the two dimensional material which forms the boundary of the cavity 7.

In other examples the cavities 7 may be larger than 200 nm. In such examples a 100 nm coating may be provided to cover, or at least partially cover, the two dimensional material which forms the three dimensional charge carrier 3 structure.

Using a two dimensional structure, such as graphene, to form the three dimensional charge carrier 3 structure allows the advantageous properties of the two dimensional material to be retained. In particular it allows the high charge mobility, sensitivity to surrounding electric field and atomic thinness to be retained.

The use of the two dimensional material to form the three dimensional structure provides for a large effective surface area for the sensor material 5 to contact the two dimensional material. This ensures that a thin layer of sensor material 5 may be distributed throughout the charge carrier 3. As the layer of sensor material 5 is very thin it allows for efficient charge transfer to the charge carrier 3. The thin layer of sensor material 5 reduces the likelihood of charge recombination within the sensor material 5. However as the sensor material 5 covers a large surface area this also allows for efficient absorption of the incident X-rays 23 or other input parameter.

In some examples the sensor material 5 may be selected to ensure band alignment with the material of the charge carrier 3 to enable efficient charge transfer between the sensor material 5 and the charge carrier 3. In some examples the ligands used to attach the sensor material 5 may be selected to enable efficient charge transfer between the sensor material 5 and the charge carrier 3. For example, short chain ligands may be used.

It is to be appreciated that other parameters may be detected in other examples of the disclosure. For instance, in some examples the sensor material 5 may comprise pyroelectric or piezoelectric materials. These materials may produce a change in electric field when the apparatus 1 is subjected to a change in temperature or an applied stress or strain. As the sensor material 5 is in contact with the two dimensional charge carrier material 3 throughout the three dimensional framework this change in electric field affects the mobility and density of charges within the charge carrier 3. This may produce a measureable change in conductivity of the apparatus 1. In such examples graphene may be used as the material within the charge carrier 3 as this is very sensitive to the field effect. In examples where the sensor material 5 comprises pyroelectric or piezoelectric materials there does not need to be any charge transfer between the sensor material 5 and the charge carrier 3.

The thickness of the charge carrier 3 layer which is need may be calculated from the equation $$\frac{I}{I_o} = e^{-x\left(\frac{\mu}{\rho}\right)}$$

Where $I_o$ is the intensity of the incident beam, $I$ is the intensity of the beam which emerges from the sample, $x$ is the mass thickness and $$\frac{\mu}{\rho}$$

is the mass attenuation coefficient.

This equation can be rewritten as $$\frac{\mu}{\rho} = \frac{\ln\left(\frac{I_o}{I}\right)}{x}$$

The mass attenuation coefficient of the material used as the sensor material 5 may be known. This may then be used to work out the thickness of the layer of quantum dot-charge carrier composite which is needed.

As an example PbS quantum dots have $$\frac{\mu}{\rho} = 25.2 \text{ cm}^2/\text{g}$$

for an incident beam of X-ray radiation at 30 KeV. To have almost all of the X-rays absorbed in the materials requires $$\frac{I}{I_o} > 100.$$

This gives a mass thickness of $x > 0.183$ g/cm². PbS has a density of 7.6/cm³ and so this requires a thickness of 24 μm.

Figure 4:
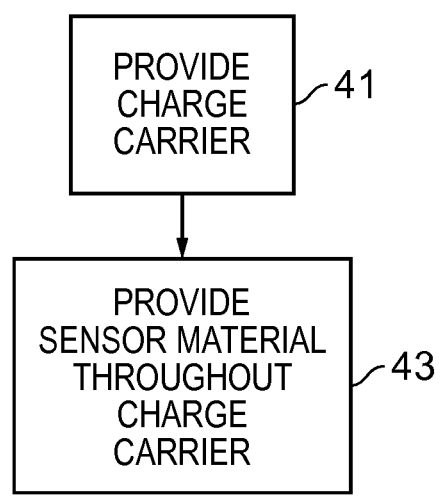
FIG. 4 illustrates a method.

FIG. 4 illustrates a method which may be used to provide an apparatus 1 such as the apparatus 1 described above. The method comprises, at block 41, providing a charge carrier 3 wherein the charge carrier 3 comprises a continuous three dimensional framework comprising a plurality of cavities 7 throughout the framework. The method also comprises, at block 43, providing sensor material 5 throughout the charge carrier 3; wherein the sensor material 5 is configured to transduce a detected input to electric charge and change conductivity of the charge carrier 3 in dependence of the detected input.

Figure 5:
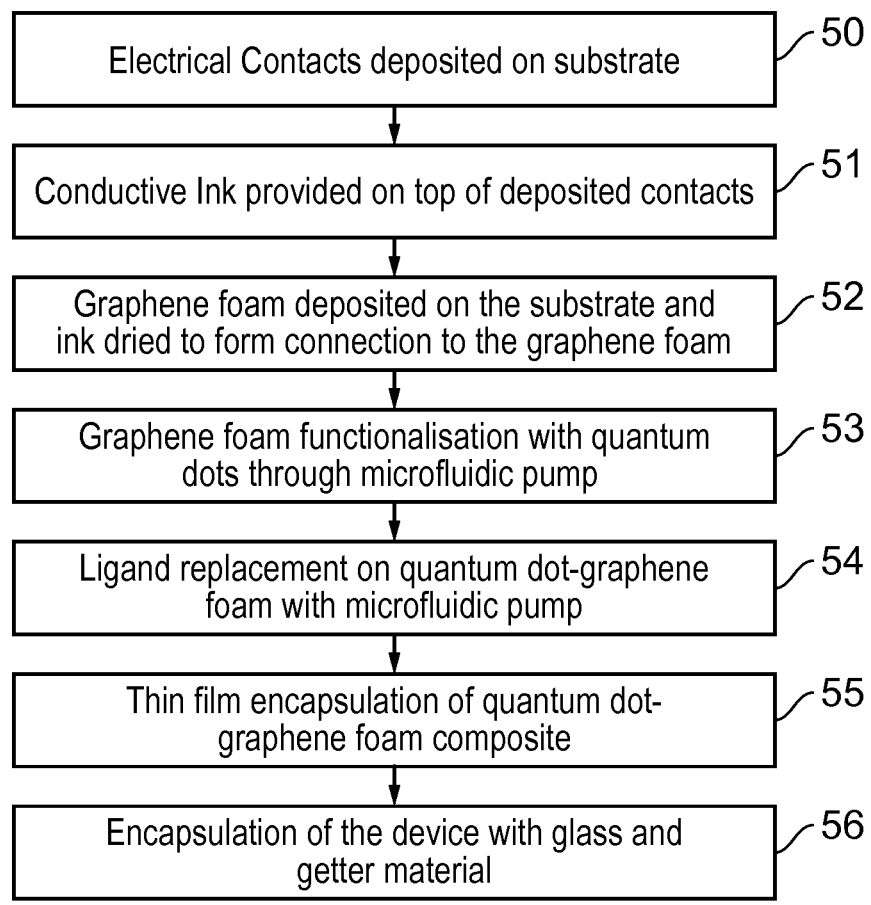
FIG. 5 illustrates a method.
Figure 6:
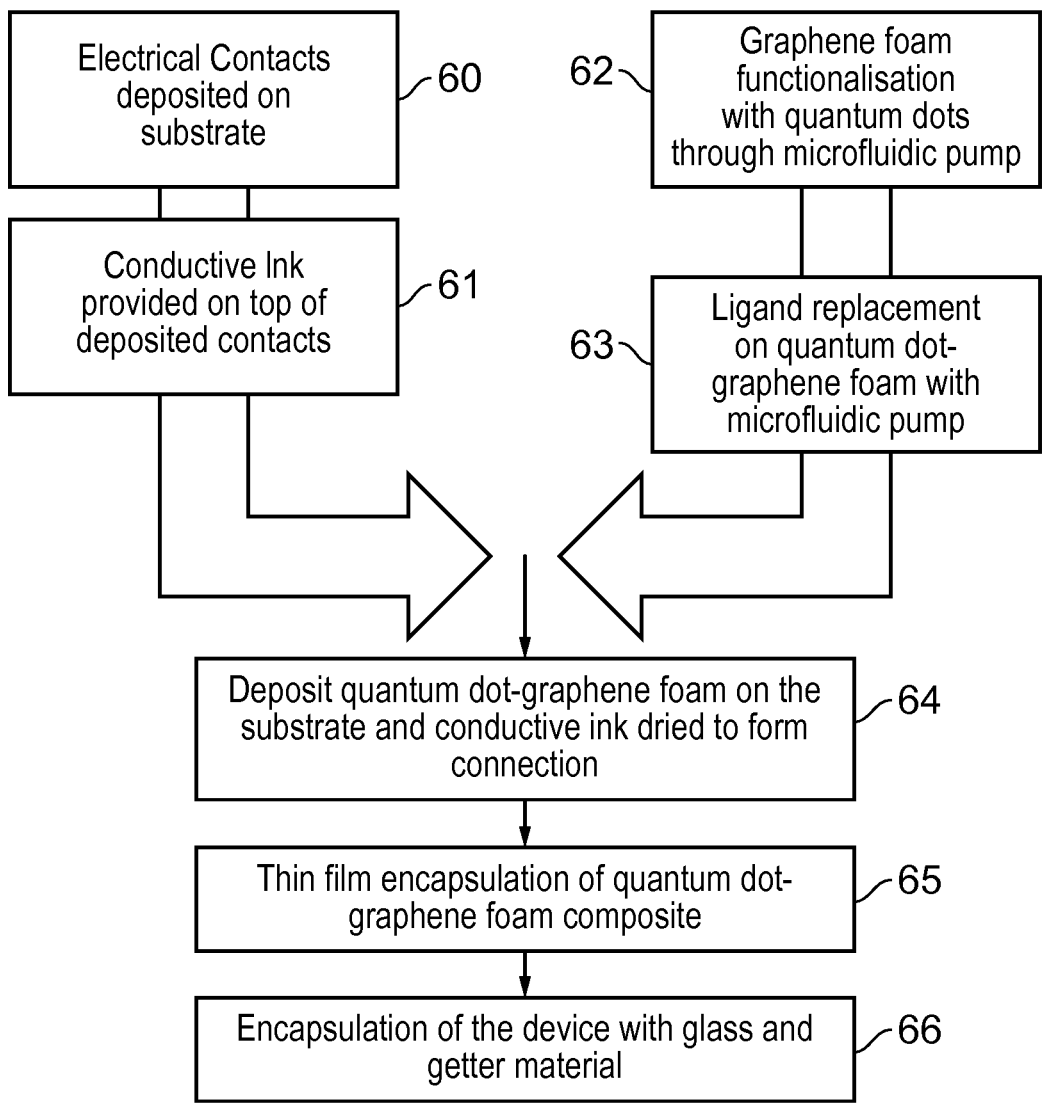
FIG. 6 illustrates a method.

FIGS. 5 and 6 also illustrate methods which may be used to provide apparatus 1 such as the apparatus of FIGS. 1 and 2. The methods may be used to form a device such as transistor 21 or thin film transistor.

In the example of FIG. 5 the method comprises, at block 50, depositing electrical contacts 27 on a substrate 25. The substrate 25 may comprise an insulating material such as glass or any other suitable material. The electrical contacts 27 may be formed from any conductive material such as metal, indium tin oxide or any other suitable material. It is to be appreciated that the material used for the substrate 25 and electrical contacts 27 could comprise flexible materials.

The electrical contacts 27 may be deposited on the substrate 25 using any suitable technique.

At block 51 a layer of conductive ink is provided on top of the deposited electrical contacts 27. This may provide a conductive trace on the surface of the substrate 25.

At block 52 a layer of graphene foam is deposited on the substrate 25. The graphene foam is deposited in contact with the conductive ink such that when the conductive ink is dried an electrical connection is established between the conductive ink and the graphene foam. The graphene foam forms the charge carrier 3 of the apparatus 1. It is to be appreciated that other materials may be used as the charge carrier 3 in other examples of the disclosure.

At block 53 the quantum dots are added to the graphene foam. The quantum dots may be deposited directly into the graphene foam structure. Any suitable technique may be used to add the quantum dots to the graphene foam. In the particular example of FIG. 5 the graphene foam is functionalised with quantum dots which are added through a microfluidic pump.

The quantum dots may be dissolved in a solvent. The solvent which is used may depend on the material which is used for the charge carrier 3 and the material which is used for the quantum dot.

The solution which is used may be selected to have a low interfacial energy with the graphene foam. The charge carrier 3 is arranged so that the graphene foam, or other charge carrier material, has a very large surface area. This provides a large surface area that needs to be covered by the solution. The solution may be selected so that the interfacial energy between the charge carrier 3 and the solution is low enough to make it thermodynamically favourable for the solution to fill the cavities 7 of the graphene foam or other charge carrier 3. The solution may have a low surface tension. The solvent which is used may be selected according to theories such as Hansen theory and Hildebrand theory. Examples of suitable solvents include N-formyl peperidine (NFP), N-methyl-pyrrolidone (NMP), N-Ethyl-pyrrolidone (NEP) or any other suitable solvent.

At block 54 ligand replacement process is carried out. The quantum dots may be synthesised with long chain ligands to provide stable structures. After the quantum dots have functionalised the graphene the long chain ligands may be replaced with short chain ligands. The short chain ligands may enable efficient charge transfer from the quantum dot to the graphene foam. In the example of FIG. 5 the ligand replacement process uses a microfluidic pump.

At block 55 thin film encapsulation is carried out. This may comprise encapsulating the apparatus 1 in a passivation layer 35. Examples of materials which may be used for the passivation layer 35 include, $SiO_2$ or any other suitable material.

At block 56 the entire device is encapsulated in a barrier material. The barrier material may comprise any material which provides an impermeable barrier around the apparatus 1. The barrier material may be selected to be permeable to some parameters but impermeable to other parameters. For instance, the barrier material may be permeable to X-rays or other electromagnetic radiation but may be impermeable to containments such as fluids and gas. In some examples the barrier material may comprise glass.

In some examples the barrier material may comprise a getter material. The getter material may comprise any material which can react with contaminants, such as fluid or gas, within the glass to prevent the contaminant from reaching the apparatus 1.

In some examples the method may comprise further processes such as cleaning of the quantum dot-graphene foam composite to remove excess unbound ligands.

The processes of depositing the quantum dots, ligand exchange and cleaning may be carried out by a microfluidic pump controlled by a programmed sequence. The microfluidic pump may be controlled to deliver each solution in turn.

FIG. 6 illustrates an alternative example for forming an apparatus 1. The method of FIG. 6 differs from the method of FIG. 5 in that, in FIG. 6 the graphene foam is combined with the quantum dots before it is added to the substrate.

In the example of FIG. 6 the method comprises, at block 60, depositing electrical contacts on a substrate and at block 61, providing a layer of conductive ink on top of the electrical contacts. This may be the same or similar to blocks 50 and 51 of the method of FIG. 5.

At block 62 the quantum dots are added to the graphene foam. Any suitable technique may be used to add the quantum dots to the graphene foam. In the particular example of FIG. 6 the graphene foam is functionalised with quantum dots which are added through a microfluidic pump.

At block 63 ligand replacement process is carried out. In the example of FIG. 6 the ligand replacement process uses a microfluidic pump. The ligand replacement process may be the same or similar to the process described above with reference to FIG. 5.

At block 64 the quantum dot-graphene foam is deposited on the substrate. The graphene foam is deposited in contact with the conductive ink such that when the conductive ink is dried an electrical connection is established between the conductive ink and the graphene foam.

At block 65 thin film encapsulation is carried out and at block 66 the entire device is encapsulated in a barrier material such as glass. These processes may be as described above with respect to FIG. 5.

It is to be appreciated that other methods of forming the apparatus 1 may be used in other examples of the disclosure. For instance, in both the methods of FIGS. 5 and 6 the quantum dots are added to the graphene foam from liquid solutions. In other examples solid crystals may be deposited from a vapour phase by using any suitable vapour deposition techniques.

In some examples the ligand replacement may be carried out in solution. In such examples the quantum dots may be synthesized with long chain ligands and dissolved in a solution. The short chain ligands may then replace the long chain ligands in the solution. After the ligand substitution the quantum dots 5 may be added to the graphene foam or other charge carrier 3.

In some examples it may be beneficial to carry out the ligand replacement in solution as this may enable a large area device to be created. This also avoids a large change in the volume of the layer of quantum dot after deposition which reduces cracks within the layers of the quantum dots.

In other examples the graphene foam may be functionalised using a self assembly monolayer. The self assembly monolayer may be arranged to have a higher affinity for the ligands on the quantum dots than graphene. The self assembly monolayer may be removed after the quantum dots have been added to the graphene foam.

In the examples of FIGS. 5 and 6 the sensor material 5 comprises quantum dots. It is to be appreciated that other types of sensor material 5 may be used in other examples.

The examples described above provide for a composite structure comprising a sensor material 5 provided throughout a charge carrier 3. The composite structure may provide for an efficient transduction of an input parameter into an electrical charge. The structure is flexible in that it can be used to detect any physical parameter depending on the material that is used as the sensor material 5.

The composite quantum dot-charge carrier 3 structure allows for the quantum dots to be provided over a large surface area of the material which forms the framework of the charge carrier 3. This allows for both efficient absorption of detected parameters and efficient charge transfer to the charge carrier 3.

The term "comprise" is used in this document with an inclusive not an exclusive meaning. That is any reference to X comprising Y indicates that X may comprise only one Y or may comprise more than one Y. If it is intended to use "comprise" with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some of or all other examples. Thus "example", "for example" or "may" refers to a particular instance in a class of examples. A property of the instance can be a property of only that instance or a property of the class or a property of a sub-class of the class that includes some but not all of the instances in the class. It is therefore implicitly disclosed that a features described with reference to one example but not with reference to another example, can where possible be used in that other example but does not necessarily have to be used in that other example.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
a charge carrier, said charge carrier having a continuous three-dimensional framework with a plurality of cavities distributed throughout, said continuous three-dimensional framework including a plurality of layers of graphene, said continuous three-dimensional framework being formed from a foam of said plurality of layers of graphene, said plurality of cavities being located within said foam; and
sensor material disposed at least within said cavities, the sensor material being capable of detecting an input from outside the charge carrier and of changing a conductivity of the charge carrier in response to the detected input, wherein the sensor material comprises quantum dots.

2. The apparatus as claimed in claim 1 wherein the continuous three-dimensional framework of the charge carrier is formed from a two-dimensional material, each of said layers of graphene being the two-dimensional material.

3. The apparatus as claimed in claim 2 wherein the two-dimensional material forms boundaries of the plurality of cavities.

4. The apparatus as claimed in claim 1 wherein the charge carrier conducts charge in any direction.

5. The apparatus as claimed in claim 1 wherein the input includes incident electromagnetic radiation.

6. The apparatus as claimed in claim 5 wherein the incident electromagnetic radiation includes X-rays.

7. The apparatus as claimed in claim 1 wherein the input includes a change in temperature.

8. The apparatus as claimed in claim 1 wherein the input includes pressure.

9. The apparatus as claimed in claim 1 wherein the input includes a change in shape of the sensor material.

10. The apparatus as claimed in claim 1 wherein the charge carrier is disposed on an insulating substrate.

11. The apparatus as claimed in claim 1 wherein the charge carrier is disposed between two electrodes.

12. A transistor comprising the apparatus as claimed in claim 1.

13. The transistor as claimed in claim 12 wherein the transistor is a thin film transistor.

14. A method comprising:
providing a charge carrier, said charge carrier having a continuous three-dimensional framework with a plurality of cavities distributed throughout, said continuous three-dimensional framework including a plurality of layers of graphene, said continuous three-dimensional framework being formed from a foam of said plurality of layers of graphene, said plurality of cavities being located within said foam; and
disposing sensor material at least within said cavities, the sensor material being capable of detecting an input from outside the charge carrier and of changing a conductivity of the charge carrier in response to the detected input, wherein the sensor material comprises quantum dots.

* * * * *